United States Patent
Maejima et al.

(10) Patent No.: US 7,388,790 B2
(45) Date of Patent: Jun. 17, 2008

(54) SEMICONDUCTOR MEMORY DEVICE AND DYNAMIC LATCH REFRESH METHOD THEREOF

(75) Inventors: Hiroshi Maejima, Tokyo (JP); Noboru Shibata, Kawasaki (JP); Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 11/510,733

(22) Filed: Aug. 28, 2006

(65) Prior Publication Data

US 2007/0237015 A1 Oct. 11, 2007

(30) Foreign Application Priority Data

Apr. 10, 2006 (JP) ............... 2006-107709

(51) Int. Cl.
*G11C 11/34* (2006.01)
(52) U.S. Cl. .............................. 365/185.25; 365/185.17
(58) Field of Classification Search ........... 365/185.25, 365/185.03, 185.17
See application file for complete search history.

(56) References Cited

U.S. PATENT DOCUMENTS

| | | |
|---|---|---|
| 6,850,435 B2 | 2/2005 | Tanaka |
| 6,885,583 B2 | 4/2005 | Tanaka |
| 6,925,004 B2 * | 8/2005 | Shibata et al. ......... 365/185.03 |
| 7,310,269 B2 * | 12/2007 | Shibata .................. 365/185.17 |

FOREIGN PATENT DOCUMENTS

JP 2004-118940 4/2004

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor integrated circuit device includes dynamic latches, switch circuit, capacitor, first static latch, and first transfer gate. In refreshing data of the dynamic latches, data stored in the first static latch is moved to the second node through the first transfer gate and saved. The data of the dynamic latch is bootstrapped. The bootstrapped data is transferred to the first node to distribute charges, thereby setting the potential of the first node. The set potential is written back to the dynamic latch to refresh it. The saved data of the second node is moved to the first node through the first transfer gate and written back to the first static latch.

20 Claims, 10 Drawing Sheets

Memory cell

Select gate transistor

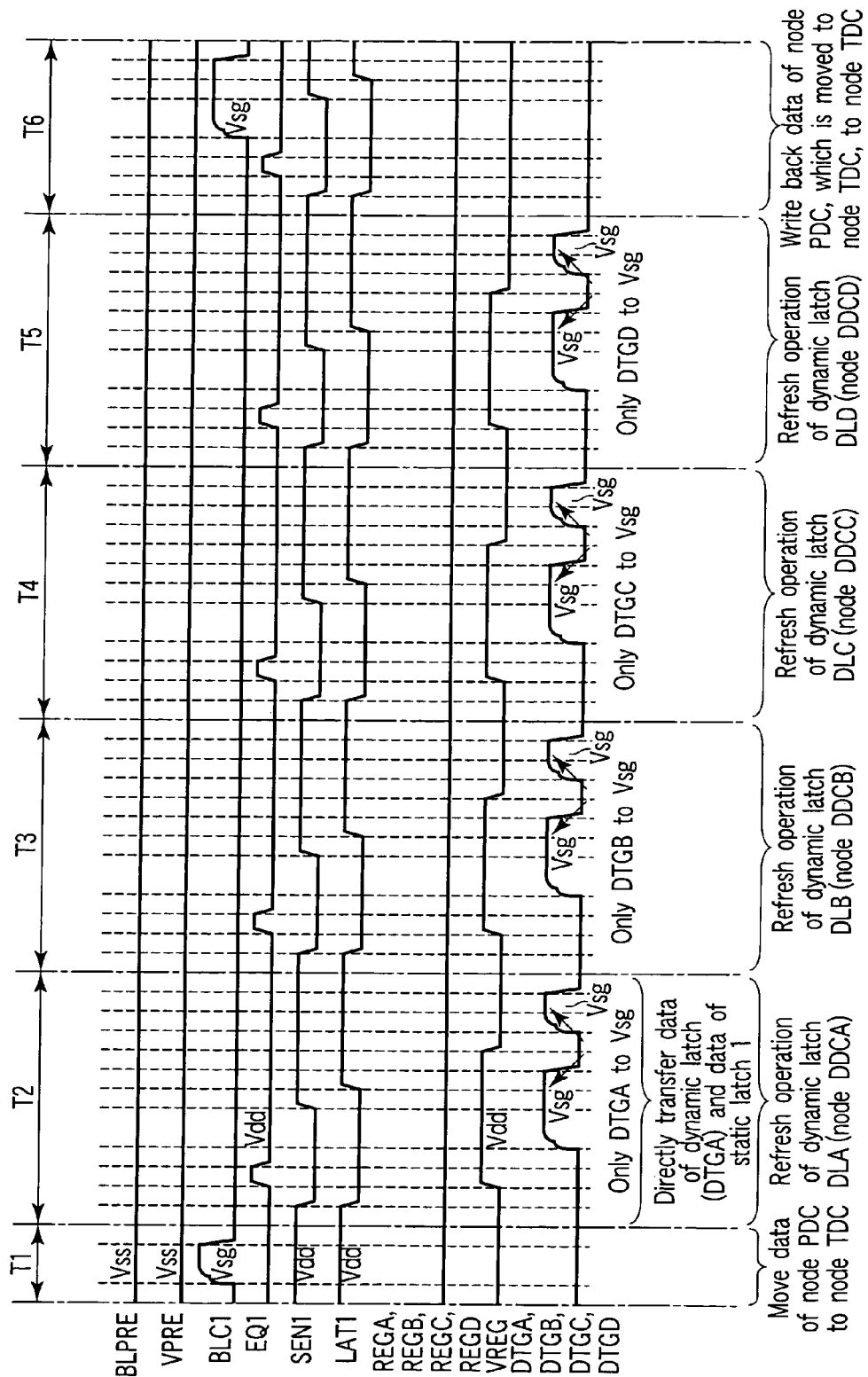
F I G. 12

SEMICONDUCTOR MEMORY DEVICE AND DYNAMIC LATCH REFRESH METHOD THEREOF

CROSS-REFERENCE TO RELATED APPLICATIONS

This application is based upon and claims the benefit of priority from prior Japanese Patent Application No. 2006-107709, filed Apr. 10, 2006, the entire contents of which are incorporated herein by reference.

BACKGROUND OF THE INVENTION

1. Field of the Invention

The present invention relates to a semiconductor memory device and a dynamic latch refresh method thereof and, more particularly, to a NAND cell flash memory.

2. Description of the Related Art

A sense amplifier of a NAND cell flash memory includes a plurality of latches, as disclosed in, e.g., Jpn. Pat. Appln. KOKAI Publication No. 2004-118940. A quaternary sense amplifier requires more latches than a binary one; an octonary one, more latches than a quaternary one; and a hexadecimal one, more latches than an octonary one. For example, a quaternary sense amplifier requires only three latches; however, a hexadecimal sense amplifier requires six (four corresponding to the 4-bit structure of the hexadecimal sense amplifier, one for program data storage, and one for quick pass write).

In a NAND cell flash memory, generally, one sense amplifier is necessary for one bit line pair. When the number of latches in each sense amplifier increases, the size of the sense amplifier increases noticeably, resulting in a large chip size.

BRIEF SUMMARY OF THE INVENTION

According to an aspect of the present invention, there is provided a semiconductor integrated circuit device comprising a dynamic latches whose output terminals are commonly connected to a first node, a switch circuit configured to selectively connect the dynamic latches to a second node, a capacitor to hold data of the second node, a first static latch whose input terminal is connected to the first node, and a first transfer gate which connects the first node and the second node on the basis of a first transfer control signal, wherein in refreshing data of the dynamic latches, data stored in the first static latch is moved to the second node through the first transfer gate and held in the capacitor, latch of the first static latch is released, data of a dynamic latch selected by the switch circuit as a refresh target is bootstrapped, the bootstrapped data is transferred to the first node to distribute charges, thereby setting a potential of the first node, the data amplified by the first static latch and held in the first node is written back to the dynamic latch as the refresh target to refresh the dynamic latch, the dynamic latches as the refresh target are sequentially selected by the switch circuit so that the dynamic latches are refreshed, and the data of the second node, which is held in the capacitor, is moved to the first node through the first transfer gate and written back to the first static latch.

According to another aspect of the present invention, there is provided a semiconductor memory device comprising a memory cell array including blocks each having NAND cell units, a clamp transistor which has a current path connected between a first node and a bit line pair in the memory cell array and executes electrical connection/disconnection on the basis of a bit line clamp signal, a precharge transistor which precharges the first node on the basis of a precharge signal, a capacitor which is connected between the first node and ground to hold data of the first node, dynamic latches whose output terminals are commonly connected to a second node, switch transistors which are provided between the first node and the dynamic latches to set a potential of one electrode of the capacitor, a first static latch having an input terminal connected to the second node, a first transfer transistor which connects the first node and the second node on the basis of a first transfer control signal, a second static latch, and a second transfer transistor which is provided between the first node and an input terminal of the second static latch to control transfer of data between the first node and the second static latch on the basis of a second transfer control signal.

According to still another aspect of the present invention, there is provided a method of refreshing dynamic latches in a NAND cell flash memory which includes a sense amplifier having dynamic latches and a static latches comprising saving data stored in the static latch, bootstrapping, in accordance with stored data, a potential held by a selected one of the dynamic latches, releasing latch of the static latch and transferring the bootstrapped potential to the static latch, and setting latch of the static latch and then transferring a potential of the static latch to the dynamic latch to write back the original data.

BRIEF DESCRIPTION OF THE SEVERAL VIEWS OF THE DRAWING

FIG. 12 is a timing chart showing the refresh operation of a dynamic latch in the NAND cell flash memory according to the embodiment of the present invention.

DETAILED DESCRIPTION OF THE INVENTION

Examinations to reach the present invention will be described first. Following this, a detailed arrangement of a semiconductor memory device according to an embodiment will be described.

Dynamic latches including a small number of elements are used for most of a plurality of latches included in a sense amplifier. Static latches with a large circuit scale are used for minimum necessary latches (e.g., a latch to store program data and a latch necessary for a write cache operation and read cache operation). With this arrangement, the pattern occupation area of the sense amplifier can be reduced effectively.

However, to hold data, the dynamic latch must be refreshed properly. The time necessary for the refresh operation increases in proportion to an increase in the number of dynamic latches. Normally, the refresh operation is executed in parallel with the program operation so that the influence on the program time is unnoticeable. However, when the refresh time increases in proportion to the number of dynamic latches, the refresh operation cannot be ended behind the program operation, resulting in an increases in program time.

Hence, in, e.g., a hexadecimal sense amplifier which requires a lot of dynamic latches, how to reduce the refresh time is important for shortening the program time and simplifying the sequence.

A semiconductor integrated circuit device, semiconductor memory device, and dynamic latch refresh method according to an embodiment of the present invention will be described next by exemplifying a hexadecimal NAND cell flash memory which comprises sense amplifiers each including four dynamic and two static latches.

(1) Example of Overall Arrangement

Figure 1:
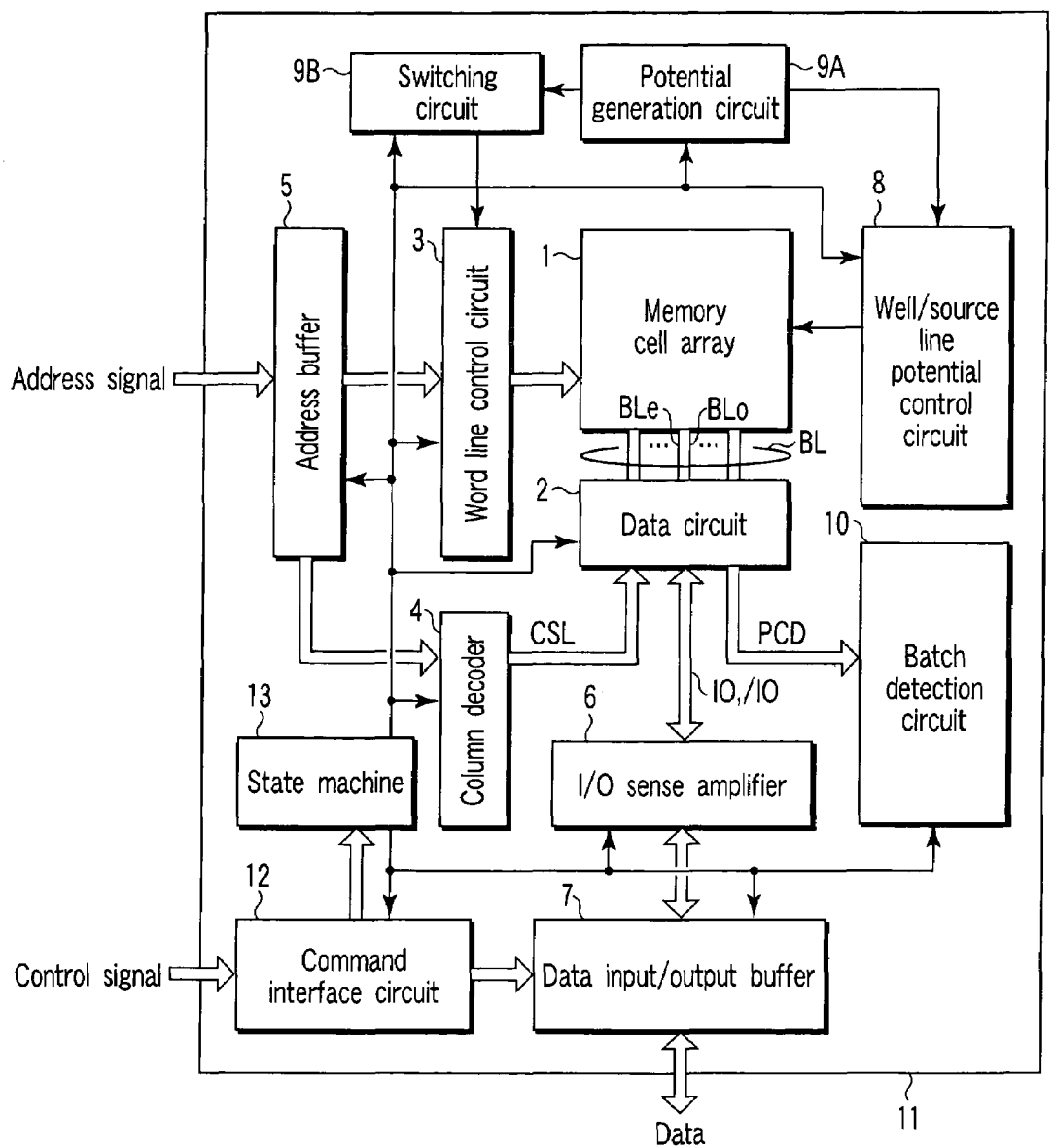
FIG. 1 is a block diagram showing a schematic arrangement example of a semiconductor memory device according to an embodiment of the present invention.

FIG. 1 is a block diagram showing a schematic arrangement example of a semiconductor memory device according to an embodiment of the present invention. The main part of a hexadecimal NAND cell flash memory is illustrated. A memory chip 11 comprises a memory cell array 1, data circuit 2, word line control circuit 3, column decoder 4, address buffer 5, I/O sense amplifier 6, data input/output buffer 7, well/source line potential control circuit 8, potential generation circuit (boost circuit) 9A, switching circuit 9B, batch detection circuit 10, command interface circuit 12, and state machine (control circuit) 13.

The memory cell array 1 is formed from a plurality of blocks. A NAND cell unit is arranged in each block. A NAND cell unit includes, e.g., a plurality of memory cells (NAND array) with current paths being connected in series, and two select gates respectively connected to the ends of the NAND array.

The data circuit 2 includes a plurality of latches (storage circuits). The data circuit 2 temporarily stores 4-bit (hexadecimal) write data in the write mode and 4-bit (hexadecimal) read data in the read mode. For this purpose, at least six latches are provided in correspondence with one bit line BL connected to a selected memory cell as a target of write/read operation. One of the six latches stores logical lower page data, and one of the remaining latches stores logical upper page data.

The word line control circuit 3 includes a row address decoder and a word line driver. The word line control circuit 3 controls the potentials of a plurality of word lines in the memory cell array 1 on the basis of the operation mode (e.g., write, erase, and read) and an address designated by a row address signal.

The column decoder 4 selects a column of the memory cell array 1 on the basis of a column address signal. In programming, write data is input to storage circuits in the data circuit 2, which belong to the selected column, through the data input/output buffer 7 and I/O sense amplifier 6. In the read, read data is temporarily stored in storage circuits in the data circuit 2, which belong to the selected column, and output from the memory chip 11 through the I/O sense amplifier 6 and data input/output buffer 7.

Of address signals, a row address signal is input to the word line control circuit 3 through the address buffer 5. A column address signal is input to the column decoder 4 through the address buffer 5.

The well/source line potential control circuit 8 controls the potentials of a plurality of well regions (e.g., double well regions each including an n-well and a p-well) corresponding to the plurality of blocks included in the memory cell array 1 and the potential of a source line in accordance with the operation mode (e.g., write, read, and erase).

The potential generation circuit 9A generates, e.g., a write potential (e.g., about 20 V) Vpp and a transfer potential (e.g., about 10 V) Vpass in the write. The potentials Vpp and Vpass are distributed to, e.g., a plurality of word lines in a selected one of the plurality of blocks included in the memory cell array 1 by the switching circuit 9B.

The potential generation circuit 9A also generates, e.g., an erase potential (e.g., about 20 V) VppE in the erase. The potential VppE is given to one or two or more well regions (both an n-well and a p-well) corresponding to one or two or more selected blocks of the plurality of blocks included in the memory cell array 1.

The batch detection circuit 10 verifies whether predetermined data is accurately written in a memory cell in programming and whether data in a memory cell is properly erased in the erase.

The command interface circuit 12 determines on the basis of a control signal generated by another chip (e.g., a host microcomputer) different from the memory chip 11 whether data to be input to the data input/output buffer 7 is command data provided from the host microcomputer. If the data to be input to the data input/output buffer 7 is command data, the command interface circuit 12 transfers it to the state machine 13.

The state machine 13 decides the operation mode (e.g., write, erase, and read) of the flash memory on the basis of the command data. The state machine 13 also controls the entire operation of the flash memory and, more particularly, the operations of the data circuit 2, word line control circuit 3, column decoder 4, address buffer 5, I/O sense amplifier 6, data input/output buffer 7, well/source line potential control circuit 8, potential generation circuit 9A, switching circuit 9B, and batch detection circuit 10 in accordance with the operation mode.

(2) Arrangement Example of Memory Cell Array

Figure 2:
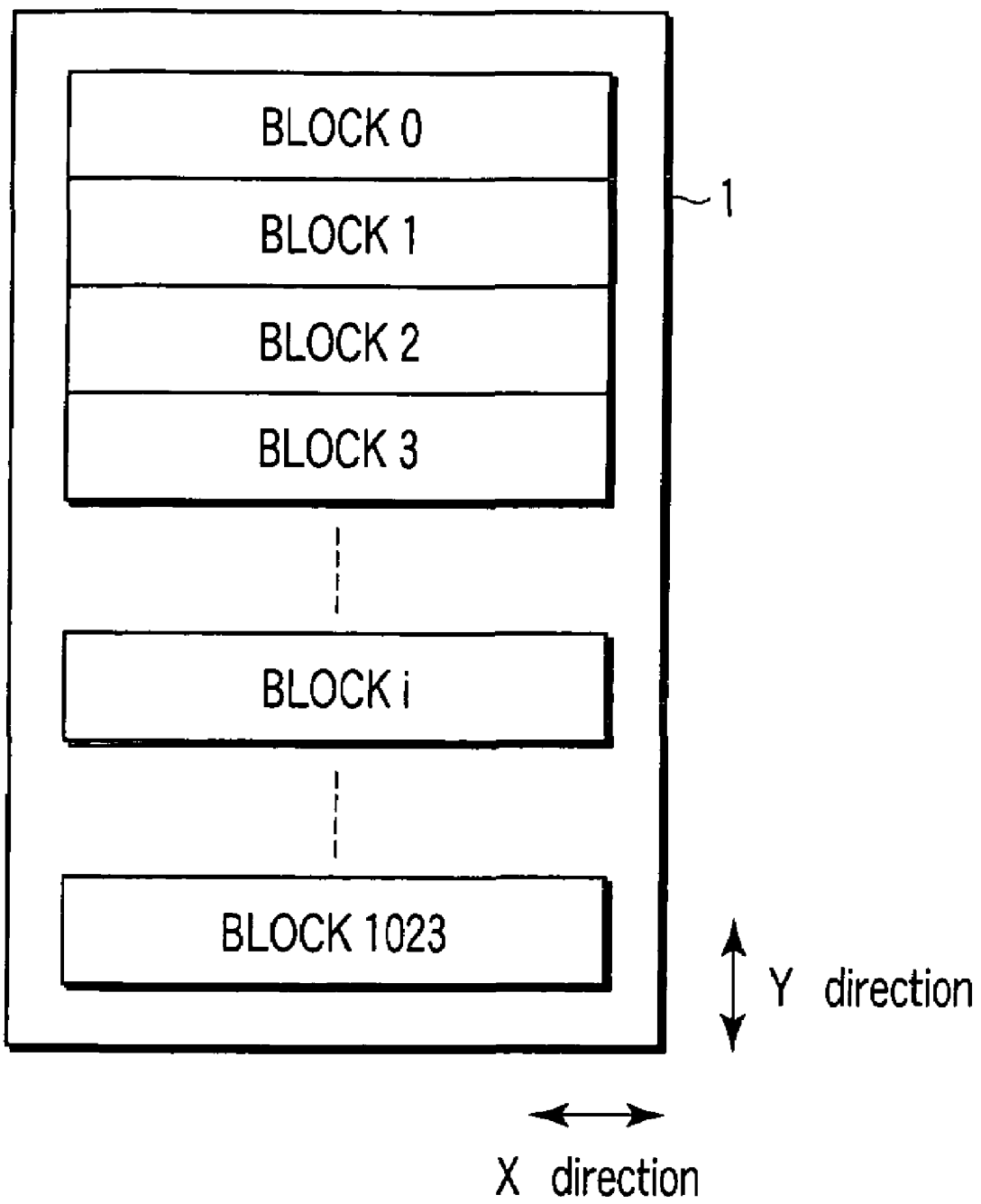
FIG. 2 is a block diagram showing an arrangement example of a memory cell array in the circuit shown in FIG. 1.
Figure 3:
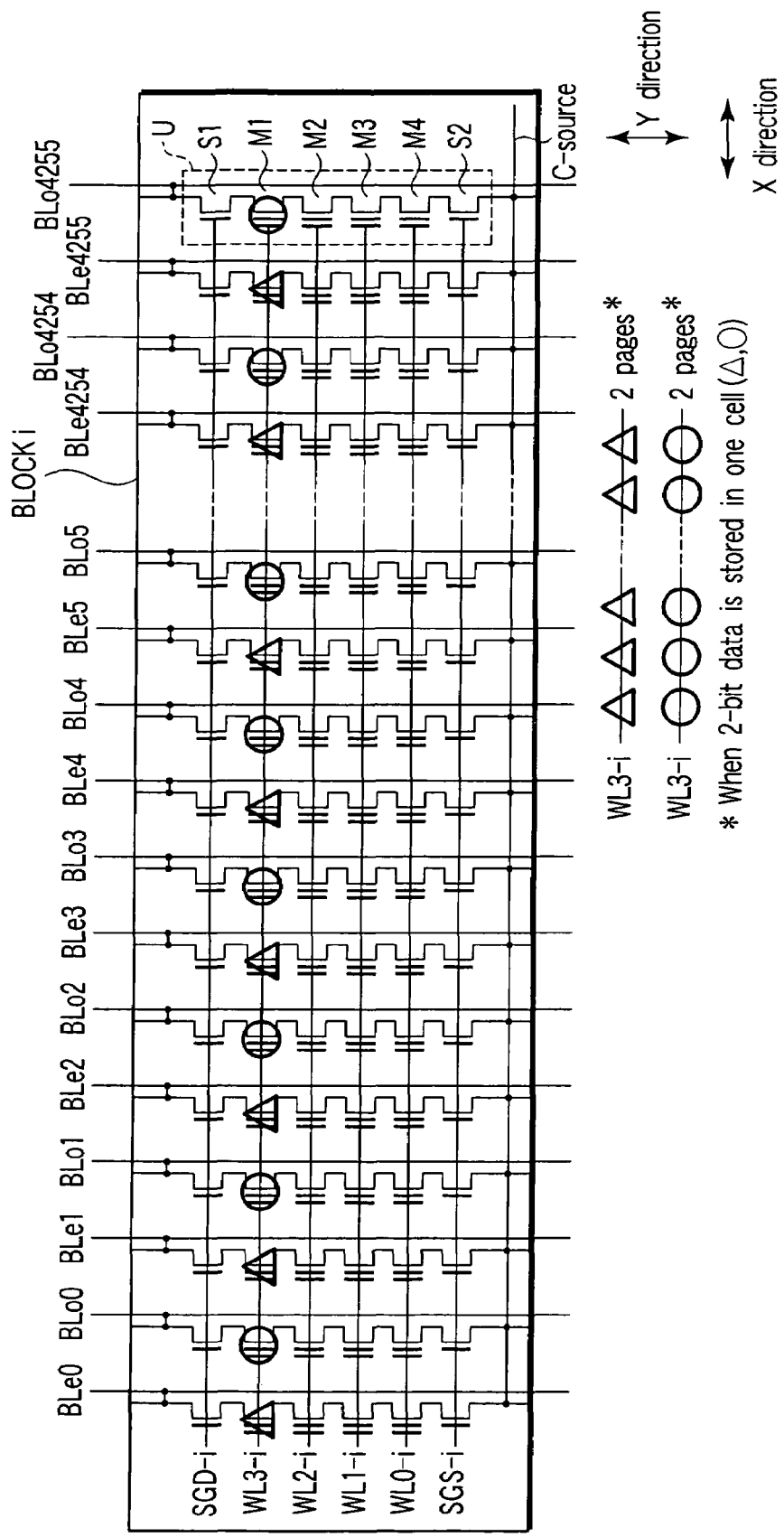
FIG. 3 is a circuit diagram showing a circuit arrangement example of one of a plurality of blocks shown in FIG. 2.

FIG. 2 shows an arrangement example of a block of the memory cell array 1 in the circuit shown in FIG. 1. FIG. 3 shows a detailed example of the circuit arrangement of a block BLOCKi of the plurality of blocks shown in FIG. 2. The memory cell array 1 includes a plurality of (in this example, 1,024) blocks BLOCK0 to BLOCK1023. The blocks BLOCK0 to BLOCK1023 are arranged in the Y direction. A block indicates the minimum unit of erase, i.e., the minimum number of memory cells that are erasable at once.

One block BLOCKi includes a plurality of (in this example, 8,512) NAND cell units U arranged in the X direction. One NAND cell unit U includes a NAND array having four memory cells M1, M2, M3, and M4 with current paths being connected in series, a select gate (MOS transistor) S1 having a current path with one end being connected to one end of the NAND array, and a select gate (MOS transistor) S2 having a current path with one end being connected to the other end of the NAND array.

In this example, the NAND array includes the four memory cells M1, M2, M3, and M4. The NAND array only need to include one or two or more memory cells. The number of memory cells is not limited to four.

The select gate S1 is connected to a bit line BLek or bit line BLok (k=0, 1, . . . , 4255). The select gate S2 is connected to a source line C-source.

Word lines (control gate lines) WL0-i, WL1-i, WL2-i, and WL3-i run in the X direction and are commonly connected to a plurality of memory cells in the X direction. A select gate line SGD-i runs in the X direction and is commonly connected to the plurality of select gates S1 in the X direction. A select gate line SGS-i also runs in the X direction and is commonly connected to the plurality of select gates S2 in the X direction.

In the above-described structure, in the write/read operation, a plurality of even-numbered bit lines BLe0, BLe1, . . . , BLe4255 counted from one end side of the block BLOCKi and a plurality of odd-numbered bit lines BLo0, BLo1, . . . , BLo4255 counted from one end side are independently driven. The bit lines are counted from 0.

More specifically, of 8,512 memory cells connected to one word line, e.g., the word line WL3-i, 4,256 memory cells (indicated by Δ) connected to the plurality of even-numbered bit lines BLe0, BLe1, . . . , BLe4255 simultaneously undergo the write/read operation. In addition, of the 8,512 memory cells connected to the word line WL3-i, 4,256 memory cells (indicated by ○) connected to the plurality of even-numbered bit lines BLo0, BLo1, . . . , BLo4255 simultaneously undergo the write/read operation.

When one memory cell stores 1-bit data, the 4,256 memory cells (indicated by Δ) located at the intersections between one word line, e.g., the word line WL3-i and the plurality of even-numbered bit lines BLe0, BLe1, . . . , BLe4255 form a unit called a page. Similarly, the 4,256 memory cells (indicated by ○) located at the intersections between the word line WL3-i and the plurality of odd-numbered bit lines BLo0, BLo1, . . . , BLo4255 also form a unit called a page.

When one memory cell stores 2-bit data, as in this example, the 4,256 memory cells (indicated by Δ) store data of two pages, and the 4,256 memory cells (indicated by ○) also store data of two pages.

(3) Example of Device Structure (a) Example of Well Structure

Figure 4:
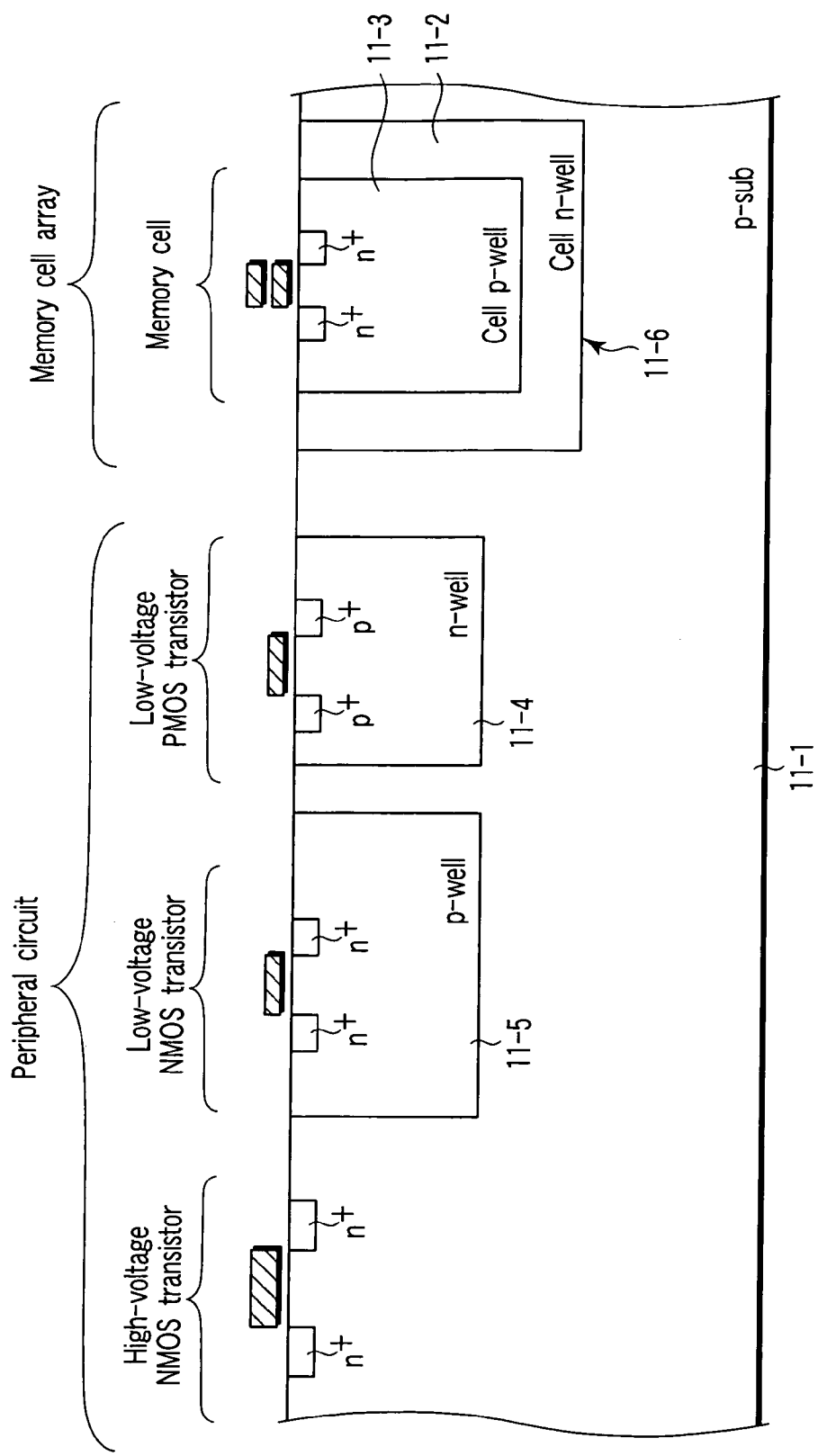
FIG. 4 is a sectional view showing an example of the well structure of a NAND cell flash memory.

FIG. 4 shows an example of the well structure of the NAND cell flash memory.

A double well region 11-6, n-type well region (n-well) 11-4, and p-type well region (p-well) 11-5 are formed in the major surface region of a p-type silicon substrate (p-sub) 11-1. In the double well region 11-6, a p-type well region (Cell p-well) 11-3 is formed in an n-type well region (Cell n-well) 11-2. The double well region 11-6 is formed in the memory cell array portion. The n-type well region 11-4 and p-type well region 11-5 are formed in the peripheral circuit portion.

A memory cell formed in the memory cell array portion includes an NMOS transistor and is arranged in the p-type well region 11-3. The n-type well region 11-2 and p-type well region 11-3 are set to an equipotential. A high-voltage NMOS transistor which is formed in the peripheral circuit portion and receives a higher voltage than the power supply voltage is formed in the major surface region of the p-type silicon substrate (p-sub) 11-1. A low-voltage PMOS transistor which is formed in the peripheral circuit portion and receives the power supply voltage is formed in the n-type well region (n-well) 11-4. A low-voltage NMOS transistor which is formed in the peripheral circuit portion and receives the power supply voltage is formed in the p-type well region (p-well) 11-5.

(b) Example of Cell Array Structure

Figure 5:
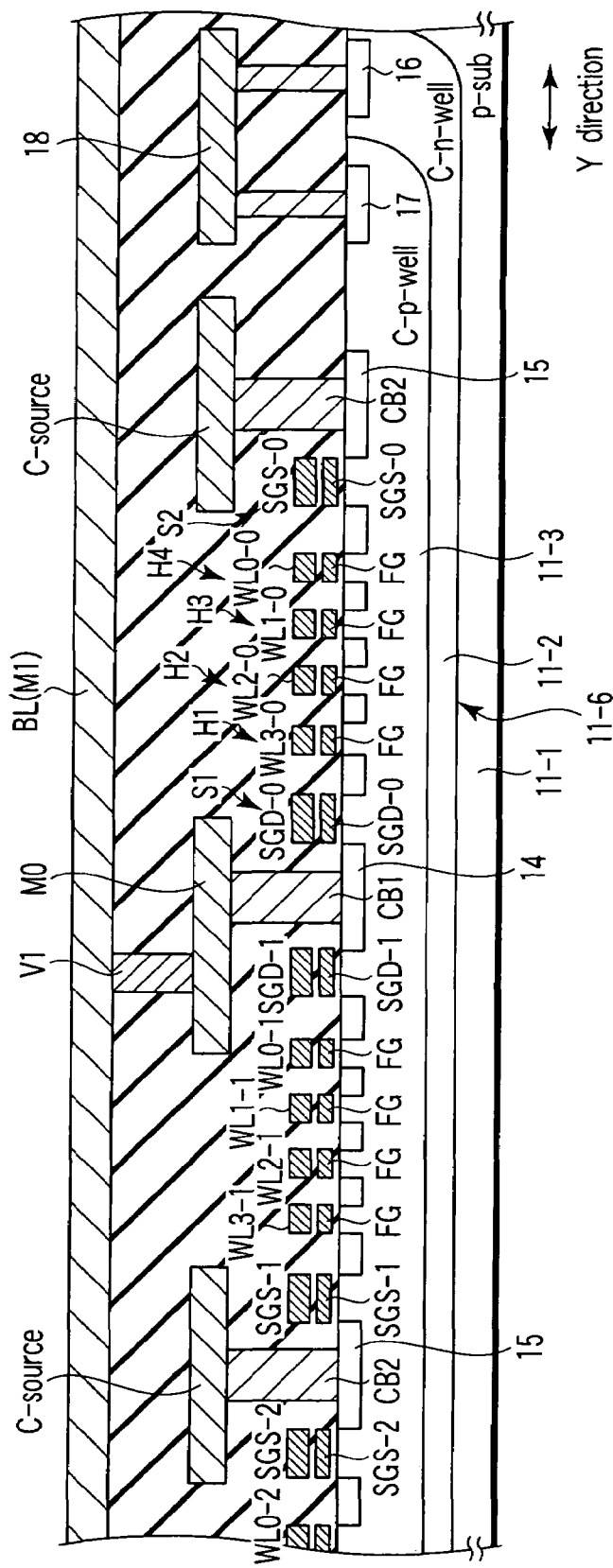
FIG. 5 is a sectional view showing a Y-direction structure example of the memory cell array portion of the NAND cell flash memory.

FIG. 5 shows an example of the Y-direction sectional structure of the memory cell array portion of the NAND cell flash memory. The double well region 11-6 including the n-type well region 11-2 and p-type well region 11-3 is formed in the p-type silicon substrate 11-1. A NAND array (the four memory cells M1, M2, M3, and M4 with the current paths connected in series) is arranged in the p-type well region 11-3. Each of the four memory cells M1, M2, M3, and M4 is formed from an NMOS transistor with a stacked gate structure including a floating gate electrode FG and a corresponding one of the control gate electrodes WL0-i, WL1-i, WL2-i, and WL3-i.

One end of the current path of the select gate S1 is connected to one end of the NAND array. One end of the current path of the select gate S2 is connected to the other end of the NAND array. Each of the select gates S1 and S2 is formed from an NMOS transistor and has the select gate lines SGS-i or SGD-i having a structure similar to the memory cells M1, M2, M3, and M4, i.e., a stacked gate structure. The select gate lines SGS-i and SGD-i are short-circuited in a region (not shown) so as to function as the gate electrodes of the NMOS transistors included in the select gates S1 and S2.

One end of the NAND cell unit, i.e., a diffusion layer (drain region) 14 of the select gate S1 is connected to a metal interconnection M0 of the first layer through a contact plug CB1. The metal interconnection M0 of the first layer is connected to a metal interconnection M1 of the second layer functioning as the bit line BL through a via plug V1. The bit line BL is connected to the data circuit 2.

The other end of the NAND cell unit, i.e., a diffusion layer (source region) 15 of the select gate S2 is connected to the metal interconnection M0 of the first layer functioning as the source line C-source through a contact plug CB2. The source line C-source is connected to the well/source line potential control circuit 8.

The n-type well region (Cell n-well) 11-2 is connected to a C-p-well potential setting line 18 through an n-type diffusion layer 16. The p-type well region (Cell p-well) 11-3 is connected to the C-p-well potential setting line 18 through a p-type diffusion layer 17. That is, the n-type well region 11-2 and p-type well region 11-3 are set to an equipotential. The C-p-well potential setting line 18 is connected to the well/source line potential control circuit 8.

Each of the floating gate electrodes FG, control gate electrodes WL0-i, WL1-i, WL2-i, and WL3-i, and select gate lines SGS-i and SGD-i is formed from, e.g., a polysilicon layer containing an impurity. The metal interconnections M0 and M1 of the first and second layers are made of, e.g., aluminum, copper, or an alloy thereof.

Figure 6:
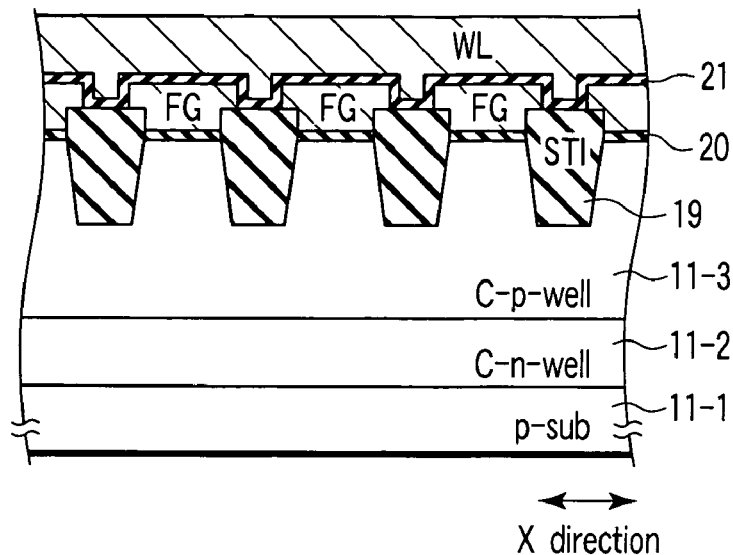
FIG. 6 is a sectional view showing an X-direction structure example of a memory cell.
Figure 7:
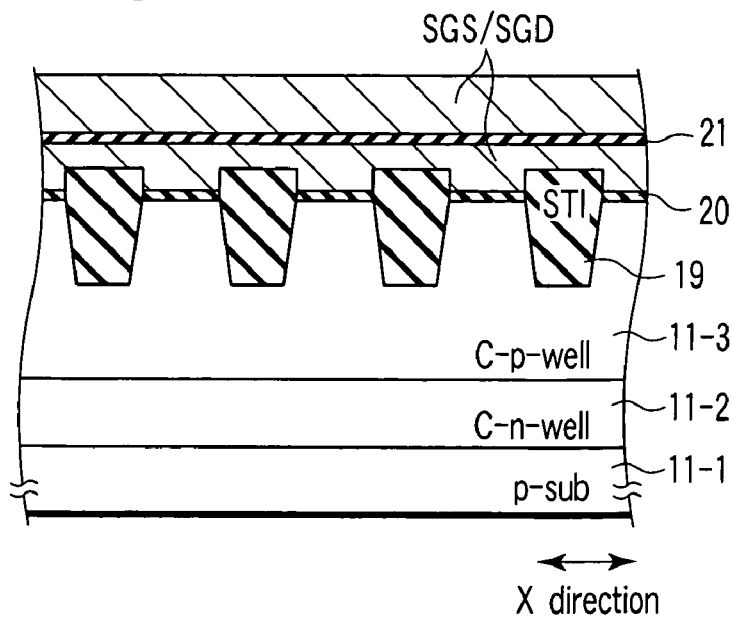
FIG. 7 is a sectional view showing an X-direction structure example of a select gate.

FIG. 6 shows an example of the X-direction sectional structure of the memory cell portion. FIG. 7 shows an example of the X-direction sectional structure of the select gate. The plurality of memory cells (FG+WL) in the X direction are electrically disconnected from each other by an element isolation region 19 with a shallow trench isolation (STI) structure. A tunnel oxide film 20 is formed on the p-type well region 11-3, and the floating gate electrodes FG are arranged on the tunnel oxide film 20. An oxide/nitride/oxide (ONO) film 21 is formed on the floating gate electrodes FG, and a control gate electrode WL serving as a word line is arranged on the oxide/nitride/oxide (ONO) film 21.

As described above, each of the select gate lines SGS and SGD has a two-layer structure. The lower select gate line SGS or SGD (SGS/SGD) and the upper select gate line SGS or SGD (SGS/SGD) are electrically connected to each other at an end of the memory cell array. Even in the memory cell array, they are also electrically connected to each other at a predetermined interval, e.g., every 512 bit lines.

(4) Arrangement Example of Batch Detection Circuit

Figure 8:
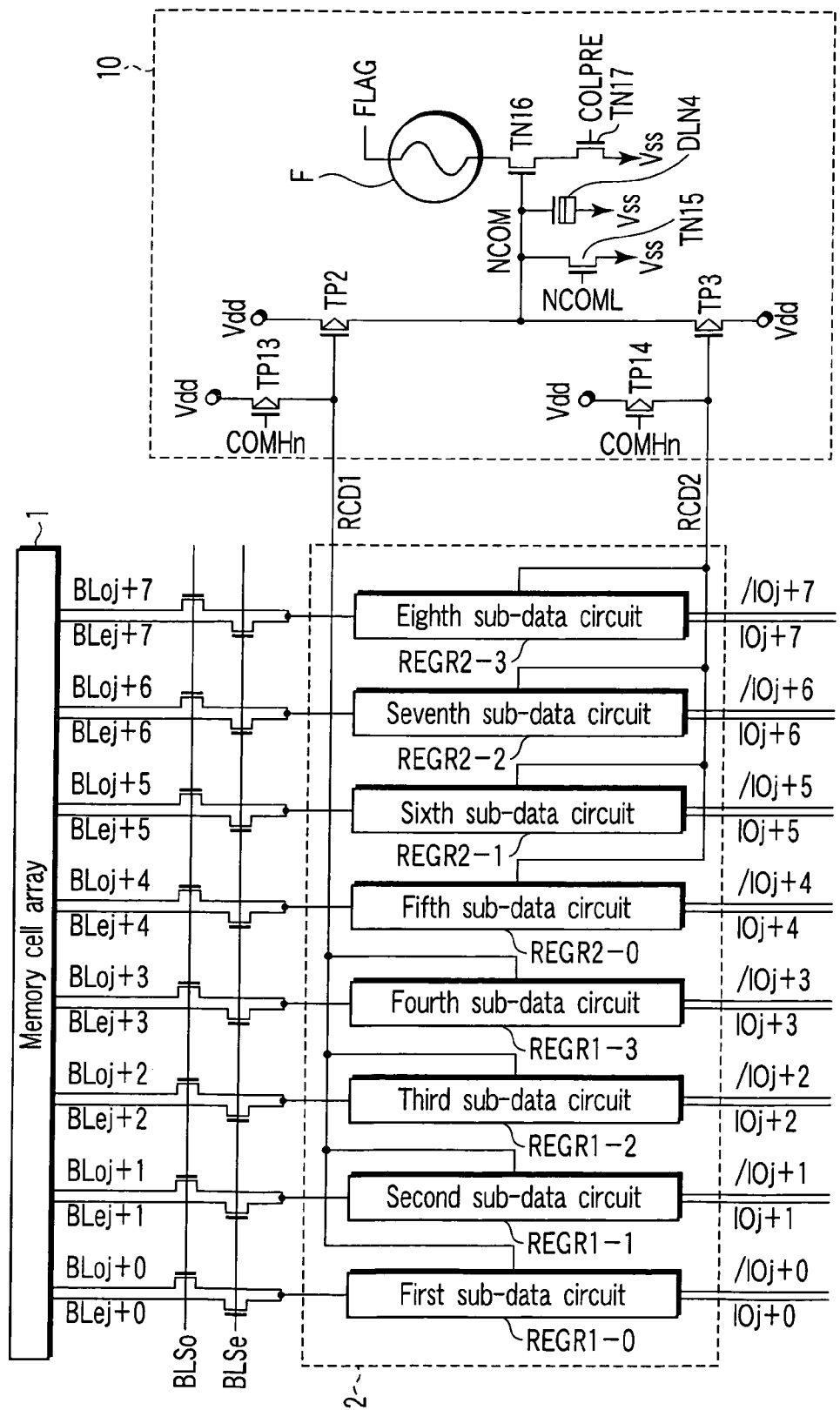
FIG. 8 is a circuit diagram showing an arrangement example of a batch detection circuit in the circuit shown in FIG. 1.

FIG. 8 shows an arrangement example of the batch detection circuit 10 in the circuit shown in FIG. 1. The batch detection circuit 10 has a function of checking after a verify read whether a write or erase is completely executed for all selected memory cells (Program/Erase completion detection).

In this example, as described above in association with the arrangement example of the memory cell array, it is assumed that the plurality of even-numbered bit lines and the plurality of odd-numbered bit lines are independently driven in the write/read operation. Hence, one sub-data circuit is provided in correspondence with a total of two bit lines including an even-numbered bit line and an odd-numbered bit line.

More specifically, since there are 8,512 bit lines BLek and BLok (k=0, 1, . . . , 4255), the data circuit 2 includes 4,256 sub-data circuits.

FIG. 8 shows eight sub-data circuits REGR1-0, REGR1-1, REGR1-2, REGR1-3, REGR2-0, REGR2-1, REGR2-2, and REGR2-3 extracted from the 4,256 sub-data circuits.

A sub-data circuit REGR1-y is connected to two bit lines BLej+y and BLoj+y and an I/O line pair IOj+y and /IOj+y. A sub-data circuit REGR2-y is connected to two bit lines BLej+y+4 and BLoj+y+4 and an I/O line pair IOj+y+4 and /IOj+y+4, where y=0, 1, 2, 3.

The first to fourth sub-data circuits REGR1-0, REGR1-1, REGR1-2, and REGR1-3 are commonly connected to an output node RCD1. The output node RCD1 is connected to the gate of a PMOS transistor TP2. Similarly, the fifth to eighth sub-data circuits REGR2-0, REGR2-1, REGR2-2, and REGR2-3 are commonly connected to an output node RCD2. The output node RCD2 is connected to the gate of a PMOS transistor TP3.

PMOS transistors TP13 and TP14 precharge the nodes RCD1 and RCD2 on the basis of a control signal COMHn when checking whether the write or erase is completely executed. More specifically, the control signal COMHn is made low to turn on the MOS transistors TP13 and TP14, thereby setting the nodes RCD1 and RCD2 to a power supply potential Vdd. Then, the control signal COMHn is made high to turn off the MOS transistors TP13 and TP14, thereby setting the nodes RCD1 and RCD2 in a floating state. At this time, the MOS transistors TP2 and TP3 are turned off.

One end of the current path of an NMOS transistor TN15 is connected to a node NCOM. The other end is connected to ground Vss. A control signal NCOML is supplied to the gate of the transistor. The MOS transistor TN15 acts to set the node NCOM to the ground potential and then in the floating state on the basis of the control signal NCOML in checking whether the write or erase is completely executed.

A capacitor DLN4 is connected to the node NCOM and the ground Vss. The capacitor DLN4 is a depletion NMOS capacitor. The gate of the MOS transistor is connected to the node NCOM, and the source and drain are connected to the ground Vss. The capacitor DLN4 acts to hold the potential of the node NCOM.

The gate of an NMOS transistor TN16 is connected to the node NCOM. One end of the current path is connected to one terminal of a fuse element F, and the other end is connected to one end of the current path of an NMOS transistor TN17. The other terminal of the fuse element F is connected to a node FLAG. The other end of the current path of the MOS transistor TN17 is connected to the ground Vss. A control signal COLPRE is supplied to the gate of the MOS transistor TN17.

In checking whether the write or erase is completely executed, a sub-data circuit corresponding to a memory cell for which the write/erase is not sufficiently executed lowers the potential level of the common node RCD1 or RCD2 from high to low.

If at least one memory cell for which the write/erase is not sufficiently executed is present, the MOS transistor TP2 or TP3 is turned on. The node NCOM goes high, and the node FLAG goes low.

On the other hand, when the write/erase is sufficiently executed for all memory cells, all sub-data circuits keep the potential level of the common nodes RCD1 and RCD2 high. The node NCOM stays low, and the node FLAG goes high.

Whether the write/erase is sufficiently executed for all selected memory cells can be checked by detecting the potential level of the node FLAG, as described above.

In this example, eight sub-data circuits are put into a group, and whether the write/erase is completely executed is checked, i.e., the potential level of the node FLAG is detected in every eight sub-data circuits.

Eight sub-data circuits are put into a group because memory cell replacement by a redundancy circuit is done for every eight columns corresponding to the eight sub-data circuits. That is, when the fuse element F is cut, memory cells connected to the eight sub-data circuits are always unselected. In place of these memory cells, reserve memory cells in the redundancy region are selected.

Hence, when memory cell replacement by the redundancy circuit is to be done for every n columns corresponding to n sub-data circuits (n is a natural number), the n sub-data circuit are put into a group.

The node FLAG is a common node corresponding to all columns. For example, when the data circuit 2 includes 4,256 sub-data circuits, and eight sub-data circuits form a unit of redundancy replacement, 532 circuits shown in FIG. 8 are present in the chip. The 532 circuits are connected to the common node FLAG.

(5) Arrangement Example of Sub-Data Circuit

Figure 9:
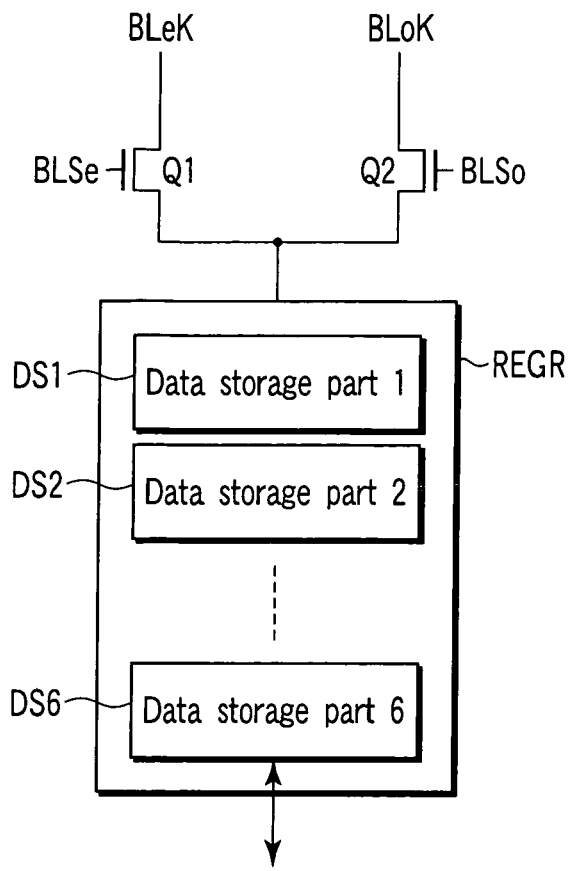
FIG. 9 is a circuit diagram showing an arrangement example of a sub-data circuit in a data circuit.

FIG. 9 shows an arrangement example of a sub-data circuit in the data circuit 2. The data circuit 2 includes a plurality of (e.g., 4,256) sub-data circuits. Each sub-data circuit has the arrangement shown in FIG. 9.

A sub-data circuit REGR has six data storage parts DS1, DS2, . . . , DS6. The read operation and program operation of 4-bit data are executed for one selected memory cell by using the data storage parts DS1, DS2, . . . , DS6. The program operation includes the write operation and verify operation.

One sub-data circuit REGR is provided in correspondence with a total of two bit lines including an even-numbered bit line and an odd-numbered bit line. The even-numbered bit line BLek is connected to the sub-data circuit REGR through the current path of an NMOS transistor Q1. The odd-numbered bit line BLok is connected to the sub-data circuit REGR through the current path of an NMOS transistor Q2.

A control signal BLSe is commonly connected to the gate of the MOS transistor Q1 connected to the even-numbered bit line BLek. A control signal BLSo is commonly connected to the gate of the MOS transistor Q2 connected to the odd-numbered bit line BLok.

In the above-described arrangement, when the control signal BLSe is high, and the control signal BLSo is low, the MOS transistor Q1 is turned on. Hence, the even-numbered bit line BLek is electrically connected to the sub-data circuit REGR. When the control signal BLSe is low, and the control signal BLSo is high, the MOS transistor Q2 is turned on. Hence, the odd-numbered bit line BLok is electrically connected to the sub-data circuit REGR.

Figure 10:
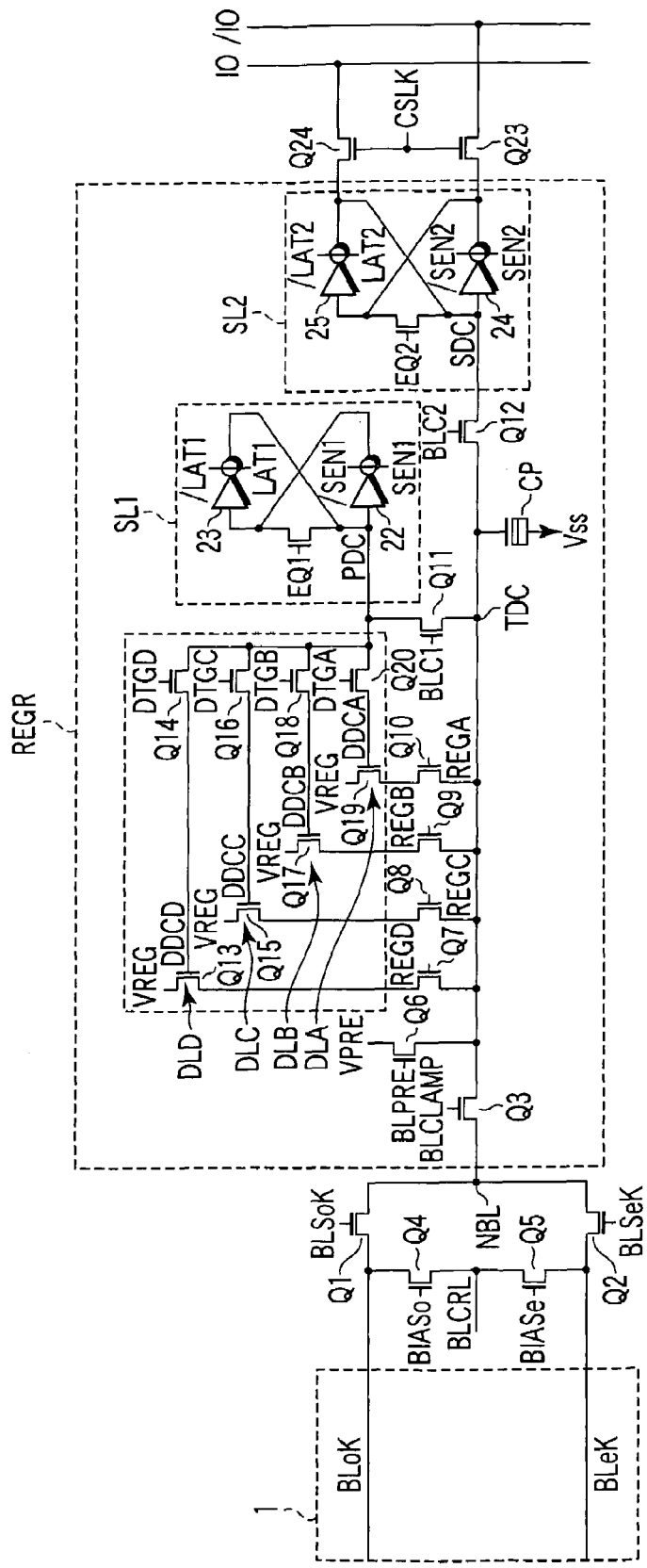
FIG. 10 is a view showing a detailed example of the sub-data circuit shown in FIG. 9.

FIG. 10 shows a detailed example of the sub-data circuit shown in FIG. 9. In this example, a sub-data circuit for one column (corresponding to the two bit lines BLek and BLok) in correspondence with FIG. 9.

The sub-data circuit REGR includes four dynamic latches DLD, DLC, DLB, and DLA and two static latches SL1 and SL2. The sub-data circuit REGR serves as a sense amplifier which senses and amplifies hexadecimal data read out from memory cells.

More specifically, one end of each of the current paths of the NMOS transistors Q1 and Q2 is connected to one end of a corresponding one of the bit lines BLok and BLek connected to a NAND cell unit in the memory cell array 1. The other end of each of the current paths of the MOS transistors Q1 and Q2 is connected to one end of the current path of an NMOS transistor Q3. The MOS transistors Q1 and Q2 are controlled by supplying control signals BLSok and BLSek to their gates so as to function as bit line selection transistors to select one bit line.

A control signal BLCLAMP is supplied to the gate of the MOS transistor Q3 to control it. The MOS transistor Q3 serves as a clamp transistor which electrically connects/disconnects a node NBL on the bit line side and a node TDC on the sub-data circuit side on the basis of the control signal BLCLAMP serving as a bit line clamp signal.

One end of each of the current paths of NMOS transistors Q4 and Q5 is connected to one end of a corresponding one of the bit line pair BLek and BLok. A bias potential (e.g., the ground potential Vss) BLCRL is applied to the other end of each of the current paths of the MOS transistors Q4 and Q5. Control signals BIASo and BIASe are supplied to the gates of the MOS transistors. The MOS transistors Q4 and Q5 function as bias transistors which supply the bias potential to one bit line on the basis of the control signals.

One end of each of the current paths of NMOS transistors Q6 to Q12 is connected to the other end (node TDC) of the current path of the MOS transistor Q3. A precharge potential VPRE is applied to the other end of the current path of the MOS transistor Q6. A control signal BLPRE is supplied to the gate of the MOS transistor Q6. Each of the four dynamic latches DLD, DLC, DLB, and DLA is connected to the other end of a corresponding one of the current paths of the MOS transistors Q7 to Q10 serving as switching circuits. Control signals REGD, REGC, REGB, and REGA are supplied to the gates of the MOS transistors Q7 to Q10, respectively.

The dynamic latch DLD includes NMOS transistors Q13 and Q14. One end of the current path of the MOS transistor Q13 is connected to the other end of the current path of the MOS transistor Q7. A potential VREG is applied to the other end of the current path of the MOS transistor Q13. The gate (node DDCD) of the MOS transistor Q13 is connected to one end of the current path of the MOS transistor Q14. A control signal DTGD is supplied to the gate of the MOS transistor Q14 so that the MOS transistor Q14 is used to transfer data stored in the static latch SL1 to the node DDCD.

The dynamic latch DLC includes NMOS transistors Q15 and Q16. One end of the current path of the MOS transistor Q15 is connected to the other end of the current path of the MOS transistor Q8. The potential VREG is applied to the other end of the current path of the MOS transistor Q15. The gate (node DDCC) of the MOS transistor Q15 is connected to one end of the current path of the MOS transistor Q16. A control signal DTGC is supplied to the gate of the MOS transistor Q16 so that the MOS transistor Q16 is used to transfer data stored in the static latch SL1 to the node DDCC.

The dynamic latch DLB includes NMOS transistors Q17 and Q18. One end of the current path of the MOS transistor Q17 is connected to the other end of the current path of the MOS transistor Q9. The potential VREG is applied to the other end of the current path of the MOS transistor Q17. The gate (node DDCB) of the MOS transistor Q17 is connected to one end of the current path of the MOS transistor Q18. A control signal DTGB is supplied to the gate of the MOS transistor Q18 so that the MOS transistor Q18 is used to transfer data stored in the static latch SL1 to the node DDCB.

The dynamic latch DLA includes NMOS transistors Q19 and Q20. One end of the current path of the MOS transistor Q19 is connected to the other end of the current path of the MOS transistor Q10. The potential VREG is applied to the other end of the current path of the MOS transistor Q19. The gate (node DDCA) of the MOS transistor Q19 is connected to one end of the current path of the MOS transistor Q20. A control signal DTGA is supplied to the gate of the MOS transistor Q20 so that the MOS transistor Q20 is used to transfer data stored in the static latch SL1 to the node DDCA.

The other end of each of the current paths of the MOS transistors Q14, Q16, Q18, and Q20 is commonly connected to the other end (node PDC) of the current path of the MOS transistor Q11. A transfer control signal BLC1 is supplied to the gate of the MOS transistor Q11. The other end of each of the current paths of the MOS transistors Q14, Q16, Q18, and Q20 is connected to the first static latch SL1.

The static latch SL1 is a CMOS flip-flop circuit including an NMOS transistor Q21 and clocked inverters 22 and 23. The input terminal of the clocked inverter 22, one end of the current path of the MOS transistor Q21, and the output terminal of the clocked inverter 23 are connected to the node PDC. The input terminal of the clocked inverter 23 and the output terminal of the clocked inverter 22 are connected to the other end of the current path of the MOS transistor Q21.

A capacitor CP is connected between the node TDC and the ground Vss. The capacitor CP is a depletion NMOS capacitor. The gate of the MOS transistor is connected to the node TDC, and the source and drain are connected to the ground Vss. The capacitor CP functions as a data storage capacitor to hold saved data. One electrode of the capacitor CP is connected to the bit line BLok through the current paths of the MOS transistors Q3 and Q1 and to the bit line BLek through the current paths of the MOS transistors Q3 and Q2.

The second static latch SL2 is connected to the other end of the current path of the MOS transistor Q12. The static latch SL2 is a CMOS flip-flop circuit including an NMOS transistor Q22 and clocked inverters 24 and 25. The input terminal of the clocked inverter 24, one end of the current path of the MOS transistor Q22, and the output terminal of the clocked inverter 25 are connected to the other end (node SDC) of the current path of the MOS transistor Q12. The input terminal of the clocked inverter 25 and the output terminal of the clocked inverter 24 are connected to the other end of the current path of the MOS transistor Q22.

One end of each of the current paths of NMOS transistors Q23 and Q24 serving as column selection switches is connected to a corresponding one of the output terminals of the clocked inverters 24 and 25. Each of an I/O line pair (data line pair) IO and /IO is connected to the other end of a corresponding one of the current paths of the MOS transistors Q23 and Q24. A column selection signal CSLk is supplied to the gates of the MOS transistors Q23 and Q24.

(6) General Operation of Sub-Data Circuit

In the above-described arrangement, when the control signal BLCLAMP is high, the MOS transistor Q3 is turned on to electrically connect, e.g., the even-numbered bit line BLek to one electrode of the MOS capacitor CP. At this time, the control signal BLSek is made high, and the control signal BLSok is made low. The control signal BIASe is made low, and the control signal BIASo is made high so that the bias potential BLCRL is supplied to the odd-numbered bit line BLok.

When the odd-numbered bit line BLok is to be electrically connected to one electrode of the MOS capacitor CP, the control signal BLSek is made low, and the control signal BLSok is made high. The control signal BIASe is made high, and the control signal BIASo is made low so that the bias potential BLCRL is supplied to the even-numbered bit line BLek.

On the other hand, when the control signal BLCLAMP is low, the MOS transistor Q3 is turned off. Hence, the nodes NBL and TDC are electrically disconnected.

The MOS transistor Q6 is an element to charge one electrode of the capacitor CP to the precharge potential VPRE. When the control signal BLPRE is high, one electrode of the capacitor CP is charged to the precharge potential VPRE.

The MOS transistor Q13 is connected to one electrode of the capacitor CP through the current path of the MOS transistor Q7. When the control signal REGD is high, i.e., the MOS transistor Q7 is on, the MOS transistor Q13 forcibly sets the potential of one electrode of the capacitor CP to VREG on the basis of the value of data stored in the data storage part (node DDCD).

For example, when data stored in the node DDCD is "1", i.e., the level of the gate of the MOS transistor Q13 is high, one electrode of the capacitor CP is forcibly set to the potential VREG as the control signal REGD goes high. When data stored in the node DDCD is "0", i.e., the level of the gate of the MOS transistor Q13 is low, the potential of one electrode of the capacitor CP is not influenced by the potential VREG.

The MOS transistor Q15 is connected to one electrode of the capacitor CP through the current path of the MOS transistor Q8. When the control signal REGC is high, i.e., the MOS transistor Q8 is on, the MOS transistor Q15 forcibly sets the potential of one electrode of the capacitor CP to VREG on the basis of the value of data stored in the data storage part (node DDCC).

The MOS transistor Q17 is connected to one electrode of the capacitor CP through the current path of the MOS transistor Q9. When the control signal REGB is high, i.e., the MOS transistor Q9 is on, the MOS transistor Q17 forcibly sets the potential of one electrode of the capacitor CP to VREG on the basis of the value of data stored in the data storage part (node DDCB).

The MOS transistor Q19 is connected to one electrode of the capacitor CP through the current path of the MOS transistor Q10. When the control signal REGA is high, i.e., the MOS transistor Q10 is on, the MOS transistor Q19 forcibly sets the potential of one electrode of the capacitor CP to VREG on the basis of the value of data stored in the data storage part (node DDCA).

The MOS transistor Q21 in the static latch SL1 is an element to equalize the potentials of the two input terminals, i.e., the input terminals of the clocked inverters 22 and 23 in the CMOS flip-flop circuit. The MOS transistor Q22 in the static latch SL2 is an element to equalize the potentials of the two input terminals, i.e., the input terminals of the clocked inverters 24 and 25 in the CMOS flip-flop circuit. That is, the MOS transistor Q21 is controlled by a control signal EQ1, and the MOS transistor Q22 is controlled by a control signal EQ2 to equalize the potentials of the input terminals of the clocked inverters.

The clocked inverter 22 operates in synchronism with clock signals SEN1 and /SEN1. The clocked inverter 23 operates in synchronism with clock signals LAT1 and /LAT1. The clocked inverter 24 operates in synchronism with clock signals SEN2 and /SEN2. The clocked inverter 25 operates in synchronism with clock signals LAT2 and /LAT2.

Note that "/" before symbols indicates an inverted signal, i.e., "bar".

Figures 11A, 11B:
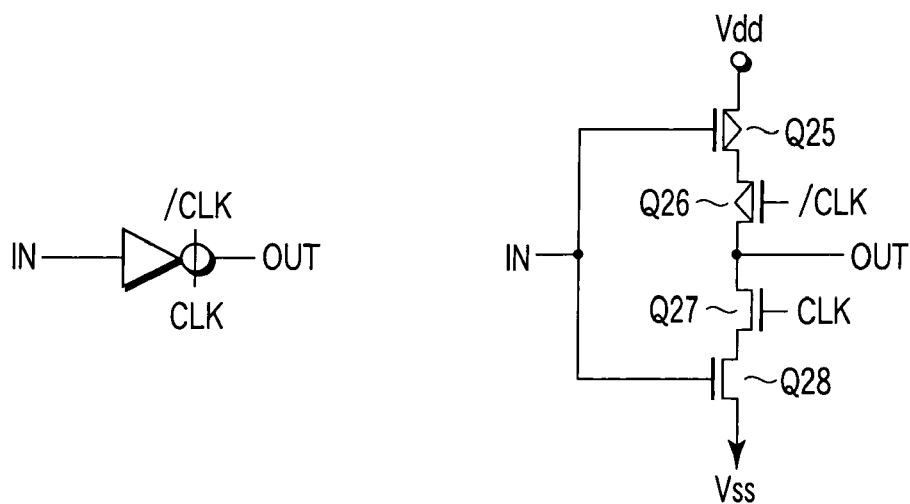
FIG. 11A is a view showing a symbol indicating a clocked inverter.
FIG. 11B is a circuit diagram showing an arrangement example of the clocked inverter.

FIGS. 11A and 11B show an arrangement example of the clocked inverters 22 to 25. FIG. 11A shows a symbol. FIG. 11B is a detailed circuit diagram. The clocked inverter operates as a CMOS inverter when a clock signal CLK is high, and a clock signal /CLK is low. On the other hand, when the clock signal CLK is low, and the clock signal /CLK is high, the clocked inverter is irrelevant to an input signal IN and output signal OUT (high impedance state).

The clocked inverter includes PMOS transistors Q25 and Q26 and NMOS transistors Q27 and Q28 whose current paths are connected in series between the power supply Vdd and the ground Vss. The input signal IN is supplied to the gates of the MOS transistors Q25 and Q28. The clock signal /CLK is supplied to the gate of the MOS transistor Q26, and the clock signal CLK is supplied to the gate of the MOS transistor Q27. The output signal OUT is output from the connection point between the current paths of the MOS transistors Q26 and Q27.

The MOS transistor Q11 serving as a switching element is connected between the node TDC and the input node PDC of the static latch SL1, i.e., the input terminal of the clocked inverter 22. The MOS transistor Q12 serving as a switching element is connected between the node TDC and the input node SDC of the static latch SL2, i.e., the input terminal of the clocked inverter 24. The MOS transistor Q11 is controlled by the transfer control signal BLC1. The MOS transistor Q12 is controlled by a transfer control signal BLC2. These MOS transistors are used to execute data transfer between the static latches SL1 and SL2.

In a column selected by a column address signal, the column selection signal CSLk (k=0, 1, . . . , 4255) goes high to turn on the MOS transistors Q23 and Q24. The static latch SL2 and the I/O line pair IO and /IO in the selected column are electrically connected.

FIG. 12 is a timing chart showing the refresh operation of the dynamic latch in the NAND cell flash memory according to the embodiment of the present invention.

In a first period T1 of data refresh, the signal BLC1 supplied to the gate of the MOS transistor Q11 rises from low level to Vsg level and again falls to low level. Accordingly, the MOS transistor Q11 is temporarily turned on to move (save) data latched in the node PDC of the static latch SL1 to the node TDC.

During a next period T2, data in the dynamic latch DLA is refreshed by executing the following operations (1) to (4).

(1) The clock signals SEN1 and LAT1 fall from the Vdd level to the Vss level, and the control signal EQ1 rises to the Vdd level. Accordingly, the potentials of the input terminals of the clocked inverters 22 and 23 are equalized so that the latch of the static latch SL1 is released.

(2) The potential VREG rises to the Vdd level, and the control signal DTGA rises to Vsg level to do bootstrapping and then transfer data in the node DDCA to the node PDC through the current path of the MOS transistor Q20. With the bootstrapping, the charge amount in the node DDCA doubles from that for "1" data. Hence, sufficient charges can be transmitted in transferring charges to the node PDC. That is, the potential of the node PDC is determined by distributing the equalized potential and the potential of the node DDCA. For both "1" data and "0" data, this potential must have a margin for the latch threshold value of the node PDC. Since the amount of charges on the "1" data side is increased by the bootstrapping operation, the margin can be ensured.

(3) The clock signals SEN1 and LAT1 rise to the Vdd level, and the control signal DTGA and potential VREG fall. Accordingly, the MOS transistor Q20 is turned on, the clocked inverters 22 and 23 execute the inverter operation, and the static latch SL1 latches data of the node DDCA. That is, the original data of the node DDCA is moved to the node PDC, amplified to 0 V or Vdd, and held.

(4) The control signal DTGA rises to Vsg level and then falls to low level. Accordingly, the original data of the node DDCA, which is amplified by the static latch SL1 and held in the node PDC, is written back to the node DDCA through the current path of the MOS transistor Q20.

With the above-described operations (1) to (4), the data of the node DDCA is refreshed.

Even in subsequent periods T3, T4, and T5, the same operation as in (1) to (4) is executed to sequentially refresh data in the dynamic latches DLB, DLC, and DLD. Hence, all the data in the dynamic latches DLA, DLB, DLC, and DLD in the sub-data circuit REGR are refreshed.

With the operation in a last period T6, the original data of the node PDC, which is transferred to the node TDC in the first period T1, is written back to the node PDC. In writing back the data, the clock signals SEN1 and LAT1 fall from the Vdd level to the Vss level, and the control signal EQ1 rises to the Vdd level to release the latch of the static latch SL1. In this state, the signal BLC1 rises from low level to Vsg level and then falls to low level again. Accordingly, the MOS transistor Q11 is temporarily turned on so that the data saved in the node TDC is transferred to the static latch SL1 and latched.

In this refresh method, charge distribution is executed for the node PDC of the static latch SL1 and the node DDCA of the dynamic latch DLA by the operation (2) to decide the potential of the node PDC. In addition, the potential margin of the transferred data is ensured by using the bootstrapping operation. With this method, the refresh operation can be done in a shorter time. Even when dynamic latches including a small number of elements are used for most of a plurality of latches included in a sense amplifier, and static latches with a large circuit scale are used for minimum necessary latches, any increase in refresh time can be suppressed, and the pattern occupation area of the sense amplifier can be reduced.

As described above, according to the semiconductor integrated circuit device, semiconductor memory device, and dynamic latch refresh method according to the embodiment of the present invention, in a NAND cell flash memory comprising sense amplifiers each having a plurality of dynamic latches, the dynamic latch refresh operation can be executed at a high speed. Hence, the program time can be shortened, and the arrangement can effectively be applied to a sense amplifier which requires a lot of dynamic latches as in a hexadecimal device.

As described above, according to one aspect of this invention, a semiconductor integrated circuit device, semiconductor memory device, and dynamic latch refresh method thereof which can suppress any increase in chip size can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   dynamic latches whose output terminals are commonly connected to a first node;
   a switch circuit configured to selectively connect the dynamic latches to a second node;
   a capacitor to hold data of the second node;
   a first static latch whose input terminal is connected to the first node; and
   a first transfer gate which connects the first node and the second node on the basis of a first transfer control signal,
   wherein in refreshing data of the dynamic latches, data stored in the first static latch is moved to the second node through the first transfer gate and held in the capacitor,
   latch of the first static latch is released,
   data of a dynamic latch selected by the switch circuit as a refresh target is bootstrapped,
   the bootstrapped data is transferred to the first node to distribute charges, thereby setting a potential of the first node,
   the data amplified by the first static latch and held in the first node is written back to the dynamic latch as the refresh target to refresh the dynamic latch,
   the dynamic latches as the refresh target are sequentially selected by the switch circuit so that the dynamic latches are refreshed, and
   the data of the second node, which is held in the capacitor, is moved to the first node through the first transfer gate and written back to the first static latch.

2. The device according to claim 1, further comprising a clamp transistor which is provided between a memory cell array and the second node to electrically connect/disconnect the memory cell array and the second node on the basis of a bit line clamp signal.

3. The device according to claim 2, wherein the memory cell array comprises NAND cell units arranged in a matrix, and a bit line pair connected to the NAND cell unit is coupled to a current path of the clamp transistor.

4. The device according to claim 3, further comprising:
a second static latch whose output terminal is connected to a column selection switch; and
a second transfer gate which is provided between the second node and an input terminal of the second static latch and controlled by a second transfer control signal.

5. The device according to claim 4, further comprising a precharge transistor which precharges the second node.

6. The device according to claim 1, wherein each of the dynamic latches comprises:
a first transistor which has a current path with one end connected to the switch circuit and the other end to receive a potential to set the second node; and
a second transistor which has a current path with one end connected to a gate of the first transistor, and a gate to which a control signal is supplied, and
the other end of the current path of the second transistor in each of the dynamic latches is commonly connected to the first node.

7. The device according to claim 4, wherein each of the first static latch and the second static latch comprises a CMOS flip-flop.

8. The device according to claim 7, wherein the CMOS flip-flop comprises:
a first clocked inverter which operates in synchronism with a first clock signal;
a second clocked inverter which has an input terminal connected to an output terminal of the first clocked inverter and an output terminal connected to an input terminal of the first clocked inverter and operates in synchronism with a second clock signal; and
a third transistor which has a current path connected between the input terminal of the first clocked inverter and the input terminal of the second clocked inverter and a gate to receive a control signal to release latch.

9. A semiconductor memory device comprising:
a memory cell array including blocks each having NAND cell units;
a clamp transistor which has a current path connected between a first node and a bit line pair in the memory cell array and executes electrical connection/disconnection on the basis of a bit line clamp signal;
a precharge transistor which precharges the first node on the basis of a precharge signal;
a capacitor which is connected between the first node and ground to hold data of the first node;
dynamic latches whose output terminals are commonly connected to a second node;
switch transistors which are provided between the first node and the dynamic latches to set a potential of one electrode of the capacitor;
a first static latch having an input terminal connected to the second node;
a first transfer transistor which connects the first node and the second node on the basis of a first transfer control signal;
a second static latch; and
a second transfer transistor which is provided between the first node and an input terminal of the second static latch to control transfer of data between the first node and the second static latch on the basis of a second transfer control signal.

10. The device according to claim 9, further comprising a column selection transistor which is provided between an I/O line pair and an output terminal of the second static latch and controlled by a column selection signal.

11. The device according to claim 9, further comprising a bit line selection transistor which is provided between a bit line pair and the clamp transistor to select one bit line on the basis of a control signal.

12. The device according to claim 11, further comprising a bias transistor which has a current path with one end connected to the bit line pair and the other end to receive a bias potential and supplies the bias potential to one bit line on the basis of a control signal.

13. The device according to claim 9, wherein
each of the dynamic latches comprises:
a first transistor which has a current path with one end connected to the switch transistor and the other end to receive a potential to set the first node; and
a second transistor which has a current path with one end connected to a gate of the first transistor, and a gate to which a control signal is supplied, and
the other end of the current path of the second transistor in each of the dynamic latches is commonly connected to the second node.

14. The device according to claim 9, wherein each of the first static latch and the second static latch comprises a CMOS flip-flop.

15. The device according to claim 14, wherein the CMOS flip-flop comprises:
a first clocked inverter which operates in synchronism with a first clock signal;
a second clocked inverter which has an input terminal connected to an output terminal of the first clocked inverter and an output terminal connected to an input terminal of the first clocked inverter and operates in synchronism with a second clock signal; and
a third transistor which has a current path connected between the input terminal of the first clocked inverter and the input terminal of the second clocked inverter and a gate to receive a control signal to release latch.

16. The device according to claim 9, wherein the first transfer control signal to turn on the first transfer transistor has a voltage higher than a sum of a power supply voltage and a threshold voltage of the first transfer transistor.

17. A method of refreshing dynamic latches in a NAND cell flash memory which includes a sense amplifier having dynamic latches and a static latches comprising:
saving data stored in the static latch;
bootstrapping, in accordance with stored data, a potential held by a selected one of the dynamic latches;
releasing latch of the static latch and transferring the bootstrapped potential to the static latch; and
setting latch of the static latch and then transferring a potential of the static latch to the dynamic latch to write back the original data.

18. The method according to claim 17, further comprising, after writing back the original data, writing back the saved data of the static latch to the static latch.

19. The method according to claim 17, wherein in bootstrapping, the potential held in the dynamic latch is a ground potential for "0" data and twice a power supply potential for "1" data.

20. The method according to claim 17, wherein saving the data stored in the static latch includes moving the data stored in the static latch to one of a capacitive node and a latch.

* * * * *